United States Patent [19]
Fujimori

[11] Patent Number: 5,990,819
[45] Date of Patent: Nov. 23, 1999

[54] D/A CONVERTER AND DELTA-SIGMA D/A CONVERTER

[75] Inventor: Ichiro Fujimori, Sagamihara, Japan

[73] Assignee: Asahi Kasei Microsystems Co., Ltd., Japan

[21] Appl. No.: 08/987,282

[22] Filed: Dec. 9, 1997

[30] Foreign Application Priority Data

Jul. 31, 1997 [JP] Japan .................................. 9-205960

[51] Int. Cl.[6] .................................................. H03M 3/00
[52] U.S. Cl. ........................................ 341/150; 341/143
[58] Field of Search .................................. 341/150, 143, 341/144, 153

[56] References Cited

U.S. PATENT DOCUMENTS 4,384,277  5/1983  Allgood .
4,616,212  10/1986  Law .
5,008,674  4/1991  Da Franca .
5,162,801  11/1992  Powell .

OTHER PUBLICATIONS

R. va de Plassche, "Interated Analog–to–Digital and Digital–to–Analog Converters," Kluwer Academic Publishers, 1994, pp. 229–230.

R. Gregorian et.al., "Switched Capacitor Circuit Design," Proc. IEEE, vol. 71, pp. 941–966, Aug. 1983.

R. T. Baird et.al., "Linearity Enhancement of Multibit IEEE Transactions on Circuits and Systems–II", vol. 42, No. 12, Dec. 1995.

Primary Examiner—Brian Young
Attorney, Agent, or Firm—Kevin L. Daffer; Conley, Rose & Tayon

[57] ABSTRACT

A D/A converter for converting a given digital signal into an analog signal includes a plurality of capacitors (C1, C2 . . . , Ci) for storing an electric charge corresponding to a predetermined reference voltage (Vr+ or Vr−). The reference voltage is selected depending on the digital signal during a period when a clock $\phi 1$ is at a high level. A switch selection (SUG1-SUGi, SB) is used to connect each of the plurality of capacitors between an input terminal and an output terminal of an operational amplifier 100 during a period when a clock +2 is at a high level.

26 Claims, 8 Drawing Sheets

D/A CONVERTER AND DELTA-SIGMA D/A CONVERTER

BACKGROUND OF THE INVENTION

1. Field of the Invention

The present invention relates to a digital-to-analog ("D/A") converter, used in signal processing and possibly with audio reproduction technology, for converting a digital signal into an analog signal. The DIA converter may additionally relate to a switched-capacitor D/A converter having low power consumption, and may further relate to a delta-sigma D/A converter using the same.

2. Description of the Related Art

In the manufacture of semiconductor integrated circuits, it is generally easier to produce capacitors than other circuit elements such as resistors, diodes, and the like. A switched-capacitor D/A converter is frequently used to perform D/A conversion, wherein the switched-capacitor D/A converter generates a desired analog signal by controlling the sampling and transfer of electric charge. The electric charge is temporarily placed on a plurality of capacitors using a digital signal, wherein the values of those capacitors are generally set at a predetermined capacitance ratio.

FIG. 1 is a circuit diagram of a conventional switched-capacitor D/A converter. The switched-capacitor D/A converter includes an operational amplifier 10. Amplifier 10 is coupled to have a voltage follower function such that an output terminal of the amplifier is connected to an inverting input terminal. The non-inverting input terminal is operably coupled to a plurality of capacitors C1 to Ci. Each of a plurality of switches SW1 to SWi is coupled to opposite ends of corresponding capacitors C1 to Ci. A plurality of switches SWG1 to SWGi are connected selectively to one of two dissimilar reference voltages Vr+ and Vr−, and also to a clock signal supply section 20 for supplying two kinds of clocks +1 and $\phi2$.

As shown in FIG. 3, the two kinds of clocks $\phi1$ and $\phi2$ supplied from the clock supply section 20 each repeat at high and low voltage levels at a predetermined interval. When one of the clocks is at the high level, the other is at the low level, so that the high levels of the two clocks do not overlap.

The switches SW1 to SWi respectively enter a closed state when the clock $\phi1$ is at the high level and otherwise enter an open state. The closed state occurs during a high level of clock $\phi1$. Furthermore, the switches SWG1 to SWGi are connected to either of two reference voltage sources Vr+ or Vr−, depending on a polarity (+1 or −1) of digital data S1 to Si. Thus, when the clock $\phi2$ is at a high level and the polarity of the digital data Si is "+1", the switches SWG1 to SWGi are respectively connected to the reference voltage source Vr+ (shown by labeling "Si·$\phi2$"). On the other hand, when the clock $\phi2$ is at a high level and the polarity of the digital data Si is "−1", the switches SWG1 to SWGi are respectively connected to the reference voltage source Vr− (shown by labeling "Sib $\phi2$"). Hereinafter, the suffix b represents a logical inversion.

The operation of the circuit shown in FIG. 1 depends on the status of the clocking signals $\phi1$ and $\phi2$. When the clock 41 is at a high level, the switches SW1 to SWi enter a closed state, and opposite (or both) terminals of all the capacitors C1 to Ci are connected to ground. When the clock $\phi2$ is at a high level subsequent to (or before) $\phi1$ being high, the switches SW1 to SWi enter an open state. At the same time, due to the operation of the switches SWG1 to SWGi, and depending on the polarity (+1 or −1) of the digital data S1 to Si, the left-hand terminals of the capacitors C1 to Ci are connected to the reference voltage source of either Vr+ or Vr−.

As a result, the distribution of electric charges occur among the capacitors, and since the total sum of the charges at a node Va (at a non-inverting input terminal position of the operational amplifier 10) becomes zero according to the law of charge conservation, the following equation (1) is given:

$$Va-Si\cdot Vr)\cdot Ci+(Va-Si-1\cdot Vr)\cdot Ci-1+ \ldots +(Va-S1\cdot Vr)\cdot C1=0 \quad (1)$$

where Vr is the absolute value of Vr+ or the absolute value of Vr−, and Ci is the capacitance of a orresponding capacitor.

In equation (1), if the capacitance values of the capacitors C1 to Ci are in the binary ratio (i.e., Ci=2·Ci−1, ..., C2=2−C1), then the following equation (2) will result:

$$(Va-Si\cdot Vr)\cdot Ci\cdot 2^{i-1}+(Va-Si-1\cdot Vr)\cdot Ci\cdot 2^{i-2}+ \ldots +(Va-S1\cdot Vr)\cdot C1=0 \quad (2)$$

Since the output (OUT) of D/A conversion becomes equal to Va due to the follower operation of the operational amplifier 10, the voltage OUT is given by the following equation (3):

$$OUT=Vr\cdot(Si\cdot 2^{i-1}+Si-1\cdot 2^{i-}+ \ldots +S1)/(2^i-1) \quad (3)$$

As explained above, according to equation (3), the switched-capacitor circuit shown in FIG. 1 performs D/A conversion of i number of bits.

Typically, a parasitic capacitance Cp is present at node Va. Parasitic capacitance is inherent in the manufacture and operation of the switching node, and is shown by the dotted line in FIG. 1. Capacitance Cp induces a term "Va·Cp" at the left side of equation (2), and a D/A conversion error will result. In practice, parasitic capacitance such as an input capacitance of the operational amplifier 10 will certainly exist. In the prior art shown in FIG. 1, the parasitic capacitance Cp adversely affects the operational accuracy of the D/A converter.

Reference documents which describe the switched capacitor D/A converter of this kind include Van de Plassche, "Integrated Analog-to-Digital and Digital-to-Analog Converters", Kiuwer Academic Publishers, 1994, pp. 229; and, Tsividis, "A Segmented u-255 Law PCM voice Encode Utilizing NMOS Technology", IEEE J, Of Solid-State Circuits, Vol. SC-11, pp. 740–747, December. 1976.

In order to solve the problems arising in the circuit of FIG. 1, a switched-capacitor D/A converter as shown in FIG. 2 may be used. The switched-capacitor D/A converter of FIG. 2 includes an operational amplifier 11 having a capacitor Ctot and a switch SA2 connected between an output terminal and an inverting input terminal of the amplifier. A switch SA1 is connected between the capacitors C1 through Ci and the inverting terminal of the operational amplifier 11. A plurality of switches SR1 through SRi are connected to opposite ends of corresponding capacitors C1 to Ci, and a plurality of switches SRG1 to SRGi are each connected to one of two kinds of reference voltage sources Vr+ and Vr−. A clock supply section 21 is used for supplying two kinds of clocks $\phi1$ and $\phi2$.

Clocks $\phi1$ and $\phi2$ supplied from the clock supply section 21 do not differ from those supplied from the clock supply section 20 shown in FIG. 1. Each of the switches SR1 through SRi includes a subswitch (labeled $\phi1$) which is connected to a right-hand terminal of the corresponding one of capacitors C1 through Ci. Subswitch $\phi1$ enters a closed state when clock $\phi1$ is at a high level, and otherwise remains open. Switches SR1 and SRi also include a subswitch (labeled φ2) which is connected to a left-hand terminal of the corresponding one of the capacitors C1 to Ci. Subswitch φ2 enters a closed state when clock φ2 is at a high level, and otherwise remains open.

The switches SRG1 to SRGi are respectively connected to one of the reference voltage sources Vr+ and Vr− depending an the polarity (+1 or −1) of digital data Si. When the clock φ1 is at a high level and the polarity of digital data Si is "+1", a respective switch SRGi is connected to the voltage source Vr+ (this situation is indicated by labeling Si·φ1). Conversely, when the lock φ1 is at the high level and the polarity of digital data Si is "−1", switch SRGi is connected to the voltage source Vr− (this situation is indicated by labeling Sib·φ1).

Switches SA1 and SA2 enter a closed state when the clocks φ2 and φ1, respectively, are at a high level, and otherwise enter an open state. During operation of the circuit in FIG. 2, when the clock φ1 is at the high level, switch SA2 and the right-hand subswitches of switches SR1 to SRi enter the closed state, and the right-hand terminals of all the capacitors C1 to Ci are connected to ground. Furthermore, due to the operation of the switches SRG1 to SRGi, the left-hand terminal of the capacitors C1 to Ci are connected to the reference voltage source Vr+ or Vr− depending an the polarity (+1 or −1) of digital data Si through S1. An electric charge is stored (or "sampled") on the capacitors C1 to Ci in accordance with the reference voltage source.

During closure of switch SA2 the output terminal (OUT) and the inverting input terminal of the operational amplifier 11 are short-circuited. Shorting the input and output terminals causes the electric charge on the feedback capacitor Ctot to becomes zero. Next, when the clock φ2 traverses to a high level, the left-hand terminals of the capacitors C1 to Ci connect to ground. At the same time, switch SA1 enters the closed state and the right-hand terminals of capacitors C2 to Ci connect to the inverting terminal of operational amplifier 11.

The inverting terminal of the operational amplifier 11 is in a virtually grounded condition. Due to the negative feedback operation of the operational amplifier 11, once clock φ1 traverses to a high level, the electric charge stored on capacitors C1 through Ci are transferred to the capacitor Ctot. This operation results in the following equation (4):

$$Vr \cdot (Si \cdot Ci + Si-1 \cdot Ci-1 + \ldots + S1 \cdot C1) = OUT \cdot Ctot \quad (4)$$

In equation (4), if the capacitance values of capacitors C1 to Ci are in a binary ratio, and also if $Ctot = Ci \cdot (2^i - 1)$, the following equation (5) is introduced:

$$Vr \cdot (Si \cdot Ci \cdot 2^{i-1} + Si-1 \cdot Ci \cdot 2^{i-2} + \ldots + S1 \cdot C1) = OUT \cdot Ci \cdot (2^i - 1) \quad (5)$$

Furthermore, from equation (5), the following equation (6) results:

$$OUT = Vr \cdot (Si \cdot 2^{i-1} + Si-1 \cdot 2^{i-2} + \ldots + S1)/(2^i - 1) \quad (6)$$

As described in equation (6), it will be seen that the switched-capacitor circuit shown in FIG. 2 performs a D/A conversion function of i bits. However, since the inverting input terminal is always in the virtually grounded condition, the charge stored in the parasitic capacitor when φ1 is at the high level is equal to that stored in the parasitic capacitor when φ2 is at the high level. The overall result is there is no parasitic capacitance added to the inverting input.

Equation (5) is true, however, only in instances of an ideal capacitance ratio. However, it is difficult to manufacture capacitors having an ideal value or capacitors with an ideal capacitance ratio. As a result, the relative inaccuracy (e.g., mismatch of the capacitance ratio) will cause a D/A conversion error. It is further known that in semiconductor circuits, the relative inaccuracy of the capacitance ratio is inversely proportional to the square root of the capacitance value. The greater the capacitance value, therefore, the smaller becomes the mismatch and the D/A conversion error.

In the switched-capacitor D/A converter shown in FIG. 2, the charges stored in capacitors C1 through Ci are transferred to the capacitor Ctot through the virtually grounded input of amplifier 11. More specifically, the charge on capacitors C1 to Ci must be transferred in substantial entirely to Ctot while ensuring the inverting input of amplifier 11 remains at ground. This assumes a substantial amount of time is needed to perform the transfer and, more specifically, for amplifier 11 to supply the transferred charge to Ctot. Accordingly, if the capacitance of capacitor Ctot is increased in order to reduce the D/A conversion error, the amount of charge to be supplied by the operational amplifier 11 will be increased. Since the current and/or power consumption of the operational 11 is determined by this electric charge to be supplied, it is difficult to realize a D/A converter (such as that shown in FIG. 2) having low power consumption and satisfactory accuracy.

Reference documents depicting the preceding arrangements include, for example, U.S. Pat. Nos. 5,162,801; 5,008,674; 4,616,212; and 4,384,277, as well as Gregorian et. al., "Switched-Capacitor Circuit Design", Proc. IEEE, Vol. 71, pp. 941–966, August. 1983.

Turning to FIG. 4, a conventional low power consumption, delta-sigma D/A converter is shown. The converter of FIG. 4 includes a digital interpolation filter 400, a digital delta-sigma modulator 410, a dynamic element matching 420, a current mode D/A converter 430, and an adder 440 capable of adding "dither" thereto.

When 18 bit data, at an Fs rate (sampling rate FS is normally 44.1 kHz) is input as the digital input signal (Din), interpolation is carried out so that a digital signal at an Fos rate (oversampling rate Fos is normally at about 64 fs) is output absent the occurrence of aliasing. Next, the 18 bit data at the Fos rate is subjected to noise-shaping by the digital delta-sigma modulator 410 and is quantized into data having a higher frequency than the sampling rate, as well as a lower resolution (about 4 bits). If the digital interpolation filter 400 and the delta-sigma modulator 410 are ideally manufactured, it will be only necessary to convert the quantized signal into an analog signal by a 4-bit D/A converter. However, since it nearly impossible to maintain the accuracy of 18 bits due to mismatch caused during manufacture of the analog elements, noise is generated due to a D/A conversion error.

For this reason, it is necessary to perform digital processing in order to shift the noise generated by the mismatch of the analog elements to an area outside the pass band of the original digital input which is usually DC to 20 kHz. This will improve the signal-to-noise ratio ("S/N ratio") within the passband. A processing section which performs such digital processing is called dynamic element matching ("DEM"). Data output from the DEM is converted into an analog signal by a 4-bit D/A converter provided at the last stage. In the example shown in FIG. 4, the output data from DEM 420 is fed to the current mode D/A converter 430. The structure of conventional DEM units are well known. For sake of brevity and so as not to detract from a better understanding of the present disclosure, explanation of DEM and the principles behind DEM is unnecessary.

In order to achieve lower power consumption, current mode D/A converter 430 has been implemented with a 4-bit D/A converter using resistors and/or current sources and avoids an operational amplifier. The mismatch of circuit elements such as resistors which construct the current mode D/A converter 430 is potentially as large as 10 times the mismatch of capacitors which occupy about the same area.

DEM 420 controls the current mode D/A converter 430 connected at the later stage by a periodic control sequence. When the mismatch of the circuit elements is large, the periodic control sequence will generate undesirable tones in the analog signal. Here, the periodic control sequence means, for example, when the current mode D/A converter 430 is provided with a plurality of segments which are combinations of current sources and or resistors. Each segment is used with predetermined periodic sequence in order to use all the segments uniformly.

As described above, although power consumption may be reduced in a conventional delta-sigma D/A converter, the S/N ratio will deteriorate as a result of the tones. In order to reduce the tones, it is proposed to add dither to the output of the delta-sigma modulator 410. Dither is a essentially quasi-random signal such as an maximum period sequence signal which is added via adder 440 so that the signal having the periodicity is randomized.

Since addition of dither is equivalent to adding noise, a problem arises in that although the tone is eliminated, the S/N ratio will be deteriorated. Also, addition of dither will increase the manufacturing cost. Thus, a conventional delta-sigma D/A converter employing the current mode D/A converter may fail to achieve both low power consumption and high S/N ratio.

Reference documents related to the above-mentioned delta sigma D/A converters include: Baird et. al., "Linearity Enhancement of Multi-Bit Delta-Sigma A/D and D/A Converters Using Data Weighted Averaging", IEEE Trans. On Cir. and Sys., 11 Vol. 42, No.12, pp. 753–762. December. 1995; and, Hamasaki et. al., "A 3 V, 22 mW Multi-Bit Current Mode Delta Sigma DAC with 100 dB Dynamic Range", IEEE Jr. of Solid-State Circuits, Vol. 31., No.12, pp. 1888–1894, December. 1996.

As set forth above, and shown in FIG. 1, D/A conversion error becomes large due to the influence of the parasitic capacitance. Even if the effect of parasitic capacitance can be eliminated as taught in FIG. 2, unacceptably large power or current consumption may result.

The circuit shown in FIG. 4 is proposed to solve the above-mentioned problems. However, the addition of dither increases manufacturing costs and is equivalent to the addition of noise. Thus, even though tones are eliminated, S/N ratio suffers.

A further problem remains in that the current mode D/A converter, which constitutes the delta-sigma D/A converter, is generally sensitive to jitter of the control clock.

SUMMARY OF THE INVENTION

The present invention is introduced to solve many of the problems set forth in the prior art. A principal objective hereof is to provide a D/A converter which performs a D/A conversion without being effected by the parasitic capacitance. The improved D/A converter also beneficially consumes less power or current and achieves a higher S/N ratio.

In order to arrive at the above-mentioned objectives, a first aspect of the invention involves a D/A converter which converts a given digital signal into an analog signal. The D/A converter includes a plurality of capacitors for storing (depending on the digital signal) a charge corresponding to a predetermined reference voltage during a first period. A switch section may also be included for connecting, during a second period, each of the plurality of capacitors in parallel to one another between an input terminal and an output terminal of an operational amplifier.

According to a second aspect of the invention, the D/A converter includes a first plurality of capacitors for storing (depending on the digital signal) a charge corresponding to a predetermined reference voltage during a first period. A first switch section may also be included for connecting, during a second period, each of the first plurality of capacitors in parallel to one another between an inverting input terminal and a non-inverting output terminal of an operational amplifier. A second plurality of capacitors may also be included for storing (depending on the digital signal) a charge corresponding to a predetermined reference voltage during the first period, and a second switch section for connecting, during the second period, each of the second plurality of capacitors in parallel to one another between a non-inverting input terminal and an inverting output terminal of the operational amplifier.

According to a third aspect of the invention and, in association with the first and second aspects described immediately above, capacitance values of the plurality of capacitors (i.e., first and/or second plurality of capacitors) are respectively set, from a small value to a large value sequentially in a binary multiple manner.

According to a fourth aspect of the invention and, in association with the first and second aspects described above, capacitance values of the plurality of capacitors are respectively set to have the same value.

According to a fifth aspect of the invention, a capacitor is provided between an output terminal and an input terminal of the operational amplifier in order to implement a low pass function.

According to a sixth aspect of the invention, a delta sigma D/A converter is provided for converting a digital signal sampled at a predetermined sampling frequency into an analog signal. The delta sigma D/A converter includes a digital interpolation filter for converting the digital signal into a second digital signal at a frequency higher than the sampling frequency by interpolating the digital signal. A digital delta-sigma modulator then converts the second digital signal into a third digital signal by noise shaping the second digital signal. A D/A converter thereafter performs digital-to-analog conversion upon the third digital signal using a plurality of capacitors, the number of which depends on the third digital signal. The capacitors store an electric charge corresponding to a predetermined reference voltage during a first period. A switch section is used to connect each of the plurality of capacitors in parallel to one another between an input terminal and an output terminal of an operational amplifier during a second period.

According to a seventh aspect of the invention, a delta-sigma D/A converter is provided for converting a digital signal sampled at a predetermined sampling frequency into an analog signal. The delta sigma D/A converter includes a digital interpolation filter for converting the digital signal into a second digital signal at a frequency higher than the sampling frequency by interpolating the digital signal. A digital delta-sigma modulator then converts the second digital signal into a third digital signal by noise shaping the second digital signal. A D/A converter thereafter performs digital-to-analog conversion upon the third digital signal using a first plurality of capacitors which store an electric charge dependent on the third digital signal. The first plurality of capacitors store an electric charge corresponding to a predetermined reference voltage during a first period. A first switch section is used to connect each of the first plurality of capacitors in parallel to one another between an inverting input terminal and a non-inverting output terminal of an operational amplifier during a second period. The D/A converter also includes a second plurality of capacitors which store an electric charge dependent on a fourth digital signal. The fourth digital signal is of opposite polarity to that of the third digital signal. The second plurality of capacitors store an electric charge corresponding to a predetermined reference voltage during the first period. A second switch section is used to connect each of the second plurality of capacitors in parallel to one another between a non-inverting input terminal and an inverting output terminal of the operational amplifier during the second period.

According to an eighth aspect of the invention and, in association with the sixth and seventh aspects, a unit which performs dynamic element matching is provided between the deltasigma modulator and the D/A converter.

According to a ninth aspect of the invention and, in association with the sixth, seventh, and eighth aspects, the capacitance values of the plurality of capacitors are set to the same value.

According to a tenth aspect of the invention and, in association with the sixth, seventh, eighth, and ninth aspects, a feedback loop of the delta-sigma modulator has a gain larger than 1.0.

BRIEF DESCRIPTION OF THE DRAWINGS

Other objects and advantages of the invention will become apparent upon reading the following detailed description and upon reference to the accompanying drawings in which.

Figure 1:
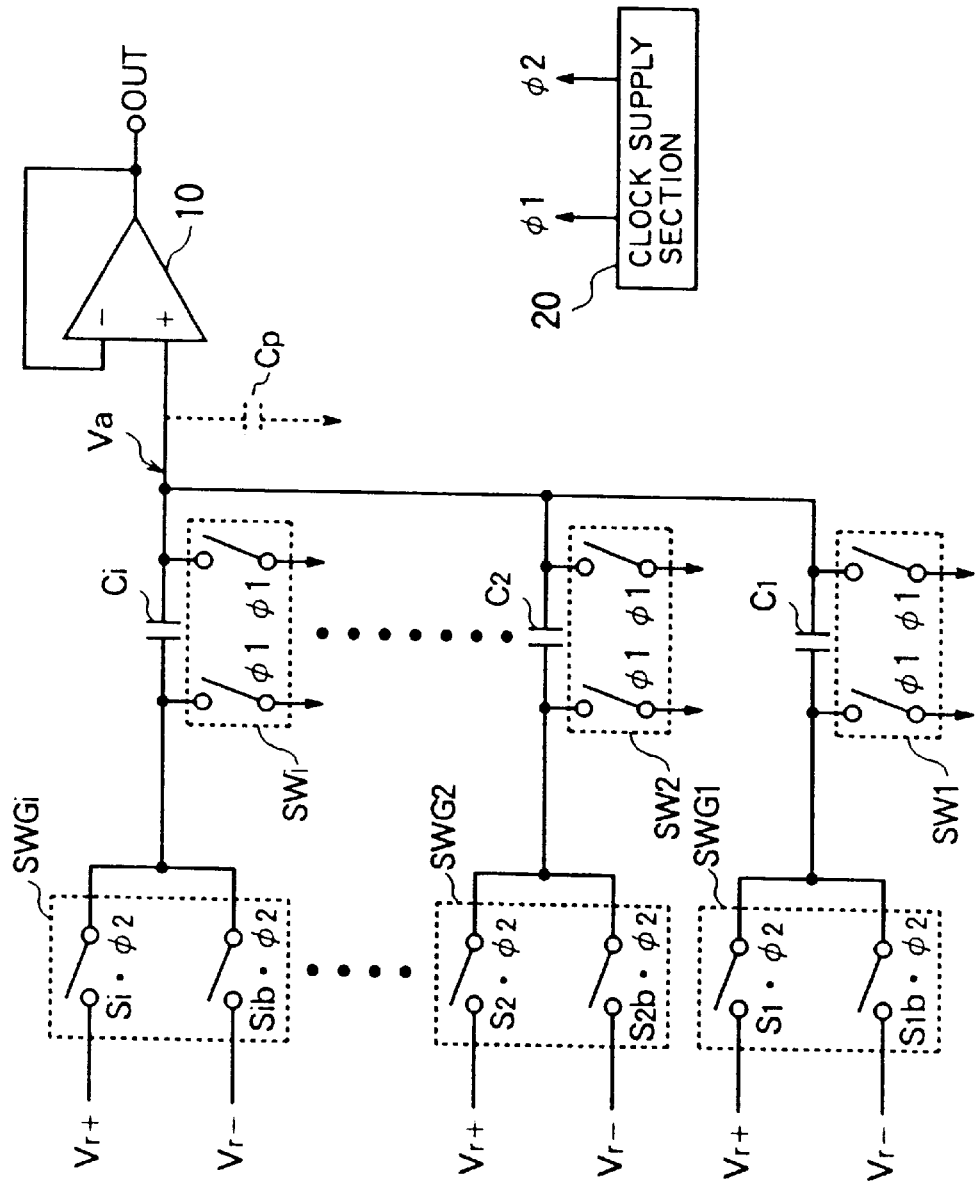
FIG. 1 is a circuit diagram of a conventional switched capacitor D/A converter.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 5:
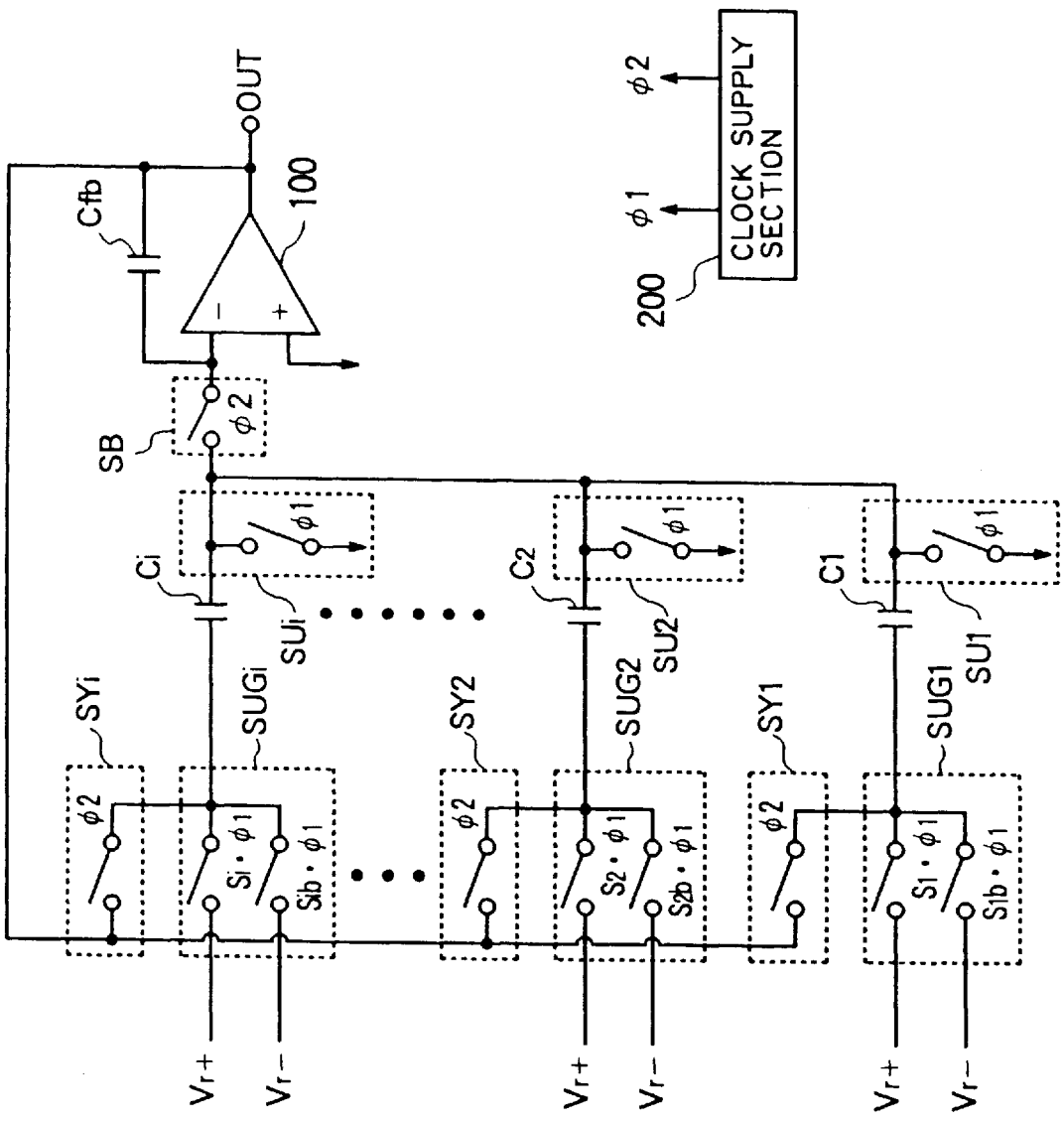
FIG. 5 is a circuit diagram of a D/A converter according to one embodiment of the present invention.

Embodiments of the present invention will be described with reference to the drawings. Turning to FIG. 5, is circuit diagram of a D/A converter is shown according to one embodiment or the present invention.

The D/A converter includes an operational amplifier 100 having an output terminal and an inverting input terminal, connected by a capacitor Cfb. A non-inverting input terminal of amplifier 100 is connected to ground. A switch SB is connected between the plurality of capacitors C1 to Ci and the inverting input terminal of the operational amplifier 100. A plurality of switches SU1 to SUi are connected to respective right-hand terminals of the plurality of capacitors C1 to Ci. Another plurality of switches SUG1 to SUGi are connected to select one of two kinds of reference voltage sources Vr+ and Vr− for placement upon left-hand terminals of capacitors C1 to Ci. Yet another plurality of switches SYI to SYi are respectively connected between the left-hand terminals of capacitors C1 to Ci and the output terminal of operational amplifier 100.

A clock supply section 200 is coupled to supply two kinds of clocks $\phi 1$ and $\phi 2$ to the D/A converter and, more specifically to the plurality of switches. Each of the two kinds of clocks $\phi 1$ and $\phi 2$ supplied from the clock supply section 200 repeat at low and high logic levels at a predetermined interval. When one clock is at the high level, the other clock is at the low level so that the high levels of the two clocks do not overlap.

The switches SU1 to SUi enter a closed state when clock $\phi 1$ is at the high level, and otherwise enter an open state. Switches SUG1 to SUGi are connected to either the reference voltage source Vr+ or Vr− depending on a polarity (+1 or −1) of digital data Si. The switches SUG1 to SUGi connect reference voltage source Vr+ to a respective capacitor C1 to Ci when $\phi 1$ is at the high level and the polarity of Si is "−1" (labeled Si·$\phi 1$). Conversely, the switches SUG1 to SUGi connect reference voltage source Vr− to a respective capacitor C1 to Ci when $\phi 1$ is at the high level and the polarity of Si is "−1" (labeled Sib−$\phi 1$). Switch SB and switches SY1 to SYi enter a closed state when $\phi 2$ is at a high level, and otherwise enter an open state.

Operation of the D/A modulator in FIG. 5 is controlled by the timing of $\phi 1$ and $\phi 2$. When $\phi 1$ is at a high level, switches SU1 to SUi enter the closed state and the right-hand terminals of the capacitors C1 to Ci are connected to ground. Depending on the polarity (+1 or −1) of digital data S1 to Si, switches SUG1 to SUGi connect the left-hand terminals of the capacitors C1 to Ci to the reference voltage source Vr+ or Vr−. Capacitors C1 to Ci respectively store an electric charge corresponding to the reference voltage selectively placed thereon.

When $\phi 2$ is at the high level, switches SU1 to SUi enter the open state at the same time when switch SB and the switches SY1 to SYi enter the closed state. This causes the capacitors C1 through Ci to be connected in parallel to one another between an output terminal (output voltage OUT) and the inverting input terminal of the operational amplifier 100. Then the distribution of the electric charges occurs among capacitors C1 to Ci, and the following equation (7) is given in accordance with the principles of electric charge conservation:

$$Vr \cdot (Si \cdot Ci + Si-1 \cdot Ci-1 + \ldots + Si \cdot Ci) = OUT \cdot (Ci + Ci-1 + \ldots + C1) \quad (7)$$

According to equation (7), if the capacitance values of capacitors C1 to Ci are in a binary ratio, that is if "Ci=2·Ci−1, . . . , C2=2·C1", then the following equation (8) results:

$$Vr \cdot (Si \cdot C1 \cdot 2^{i-1} + Si-1 \cdot C1 \cdot 2^{i-2} + \ldots + S1 \cdot C1) = OUT \cdot C1 \cdot (2^i - 1) \quad (8)$$

The voltage OUT delivered at the output terminal is expressed by the following equation (9):

$$OUT = Vr \cdot (Si \cdot 2^{i-1} + Si-1 \cdot 2^{i-2} + \ldots + S1)/(2^i - 1) \qquad (9)$$

According to equation (9), the switched-capacitor circuit shown FIG. 5 is an i bit binary D/A converter. If the capacitance values of the capacitors C1 to Ci are equal then, according to equation (7), OUT becomes $OUT = Vr \cdot (Si+Si-1+ \ldots +S1)/i$, to realize an i bit linear level D/A converter.

Capacitor Cfb connected between the output terminal and the inverting input terminal of the operational amplifier 100 holds the result of the last D/A conversion, while φ1 is at the high level. This helps maintain a normal operation range for operational amplifier 100 throughout the various clock signals. Thus, Cfb helps prevent the operational amplifier 100 from generating an output of an unpredictable value, so that the operation of the operational amplifier 100 remains within its normal operation range. Of additional benefit is capacitor Cfb providing a low-pass characteristic to the switched-capacitor circuit, as will be described later. The smaller the capacitance value of capacitor Cfb, the more flat will be the D/A conversion characteristic in a high frequency region. Yet, presence of capacitor Cfb does not affect the accuracy of the D/A conversion.

Figure 2:
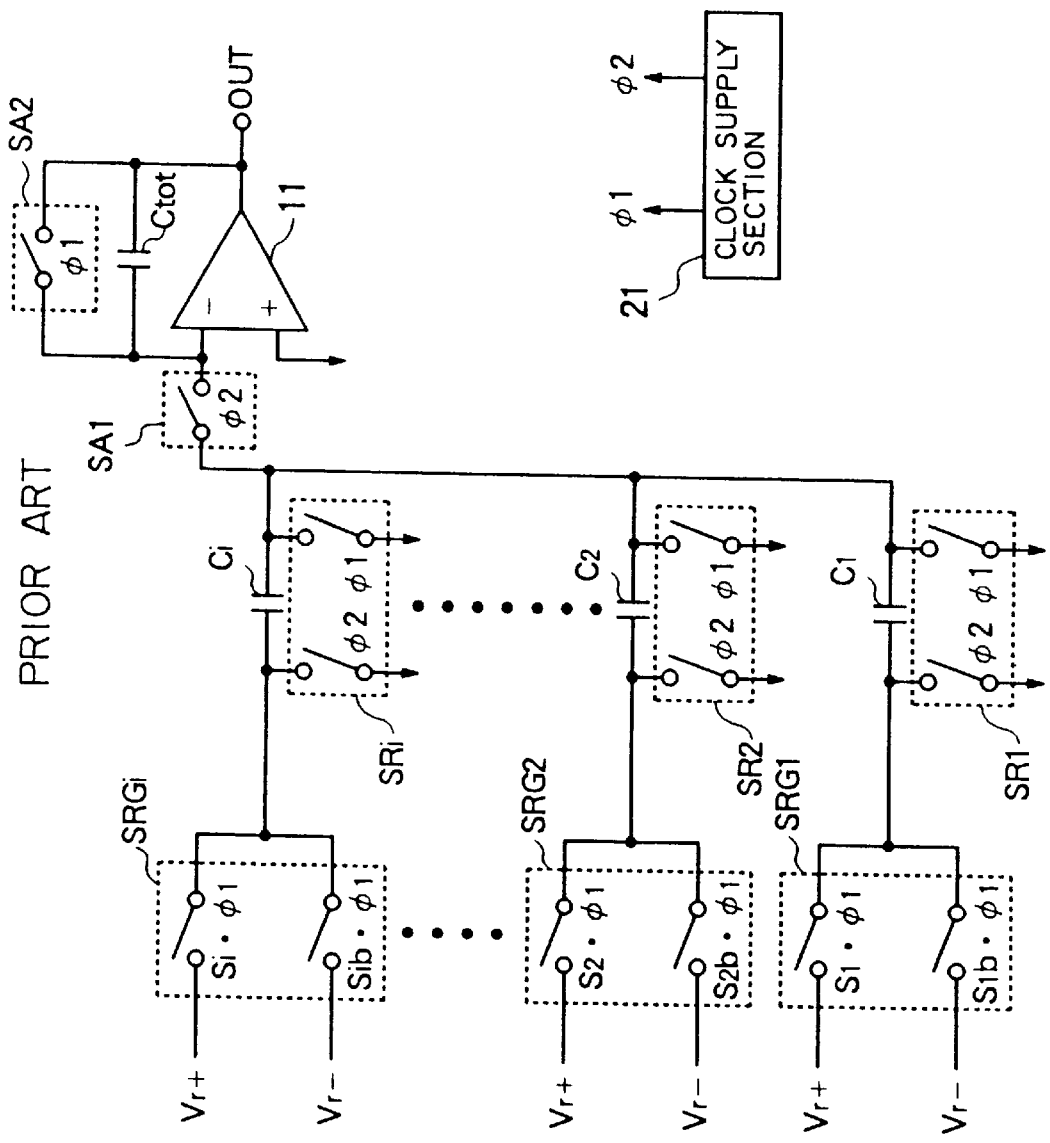
FIG. 2 is a circuit diagram of another conventional switched-capacitor D/A converter.

According to this embodiment, the following advantages are offered. First, the switched-capacitor D/A converter is arranged such that the capacitors for sampling the voltage of the reference voltage source and capacitors for forming a negative feedback loop between the input terminal and the output terminal of the operational amplifier are commonly used. Thus, there is no need to transfer the electric charge from the capacitors C1 through Ci to the capacitor Cfb as in the conventional technique shown in FIG. 2, so the supply operation of the operational amplifier is not required. Instead, the D/A converter output is generated by charge distribution among the capacitors passively without requiring any assistance from the amplifier. Therefore, the present circuit and specifically the operational amplifier consumes a lesser amount of current and/or power. Whatever power is consumed is a minimum amount sufficient to meet the specification of thermal noise of the operational amplifier. This allows for a D/A converter with small current and/or power consumption to be realized.

As described in the foregoing, when the capacitance values of the capacitors are increased, the mismatch is reduced and the accuracy is improved. Thus, it becomes possible to improve the accuracy of the D/A conversion by increasing the capacitance values of the capacitors. In this case, since the operational amplifier does not perform the electric charge supply operation even when the capacitance values of the capacitors are increased, it is possible to realize a D/A converter with higher S/N ratio while reducing the current consumption.

In this embodiment, "kT/C noise" which is the cause of the deterioration of the S/N ratio in the switched-capacitor circuit can be reduced without increasing the current consumption. The kT/C noise is generated by the thermal noise of the switch, and since its magnitude is inversely proportional to the capacitance values of the capacitors, the larger the capacitor values the smaller becomes the kT/C noise. Thus, according to this embodiment, it is possible to reduce the kT/C noise without increasing the current consumption of the operational amplifier.

Furthermore, according to this embodiment, since the inverting input terminal of the operational amplifier enters the virtually grounded condition, the inverting input terminal is maintained always at a constant voltage, and it is not affected by the parasitic capacitance.

Figure 6:
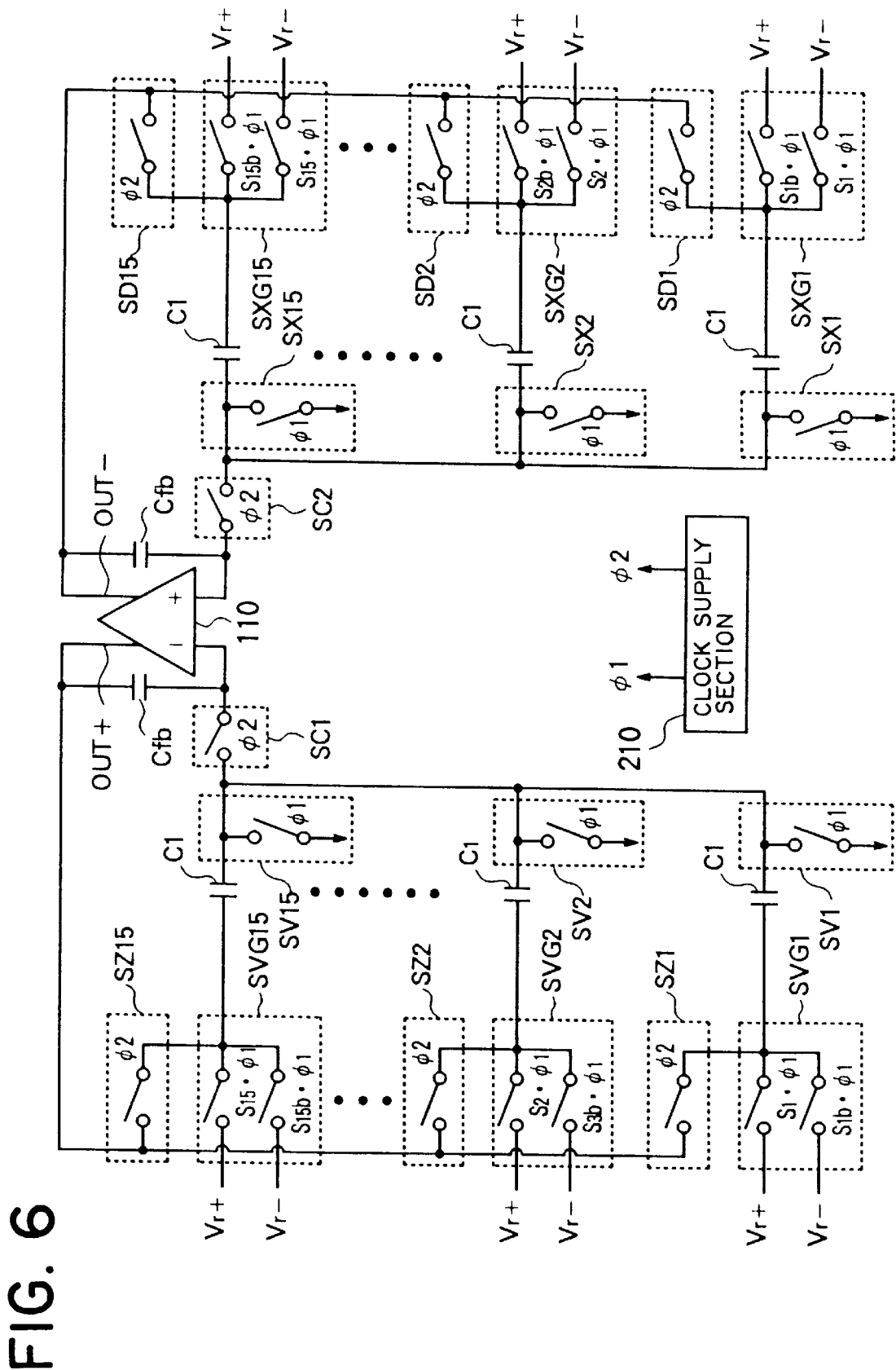
FIG. 6 as a circuit diagram of a D/A converter according to another embodiment of the present invention.

Referring to FIG. 6, a D/A converter is shown according to another embodiment. This embodiment is characterized in that a fully differential type operational amplifier is used. The circuit shown in FIG. 5 illustrates a D/A converter employing a so-called single ended ("one side") type operational amplifier. In practice, in order to realize a semiconductor integrated circuit containing a digital circuit and an analog circuit mixed as in the delta-sigma D/A converter, it is necessary to remove what is referred to as "common mode noise". In order to remove common mode noise, a circuit arrangement of the fully differential type is needed.

Further, instead of using the binary type D/A converter as shown in FIG. 5, in order to use the dynamic element matching, sometimes a linear level type D/A converter having an equal weight for each bit is used. Accordingly, an example of realizing the linear level type D/A converter will be explained.

The circuit of FIG. 6 is a fully differential type circuit, shown with a fifteen level, linear level type D/A converter that includes an operational amplifier 110 having a non-inverting output terminal (OUT+) and an inverting input terminal connected by a capacitor Cfb (e.g., equal to 30·C1), and having an inverting output terminal (OUT−) and a non-inverting input terminal connected by a capacitor Cfb (e.g., equal to 30 C1). The D/A converter also includes fifteen capacitors C1 at the non-inverting output side (left-hand side in the drawing), fifteen capacitors C1 at the inverting output side (right-hand side in the drawing), a switch SC1 connected between the capacitors C1 at the non-inverting output side and the inverting input terminal of the operational amplifier 110, a switch SC2 connected between the capacitors C1 at the inverting output side and the non-inverting input terminal at the operational amplifier 110, switches SVI to SV15 respectively connected to right-hand terminals of the capacitors C1 at the non-inverting output side, switches SX1 to SX15 respectively connected to left-hand terminals of the capacitors C1 at the inverting output side, switches SVG1 to SVG15 connected to select one of two kinds of reference voltage sources Vr+ and Vr−, switches SZI to SZ15 respectively connected between left-hand terminals at the capacitors C1 at the non-inverting output side and the non-inverting output terminal at the operational amplifier 110, switches SXG1 to SXG15 connected to select one of two kinds of reference voltage sources Vr+ and Vr−, switches SD1 to SDI5 respectively connected between right-hand terminals of the capacitors C1 at the inverting output side and the inverting output terminal of the operational amplifier 110, and a clock supply section 210 for supplying two kinds of clocks φ1 and φ2.

Figure 3:
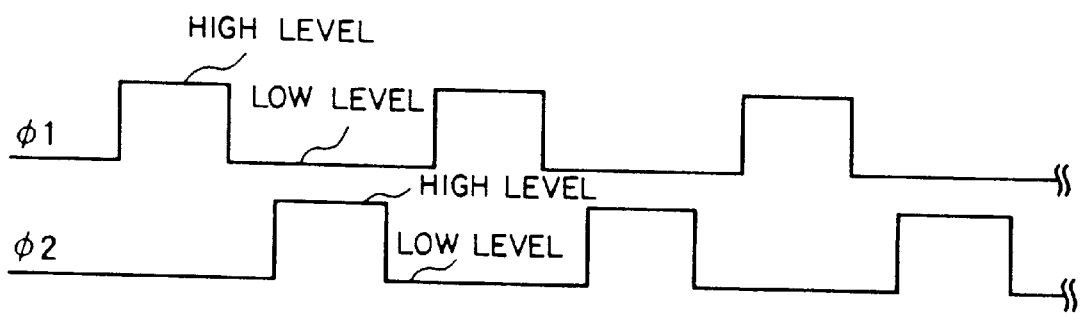
FIG. 3 is a timing diagram of a clock supplied to the D/A converter.
Figure 4:
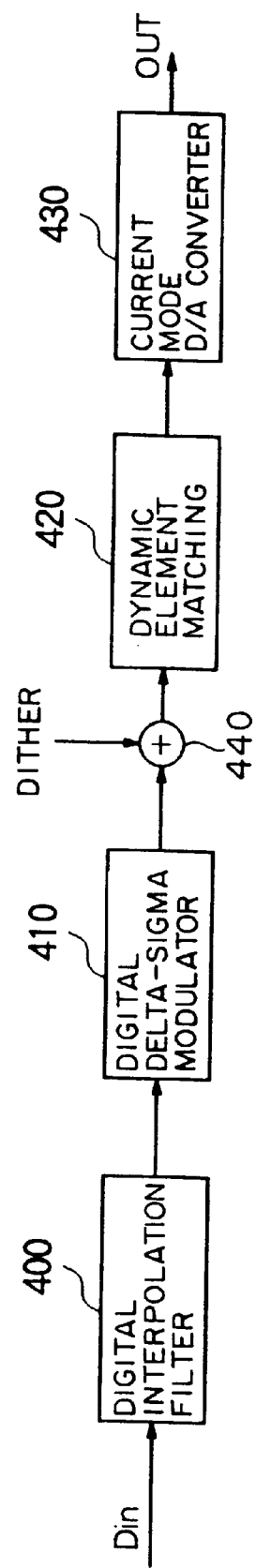
FIG. 4 is a block diagram of a conventional delta-sigma D/A converter.

The two kinds of clocks φ1 and φ2 supplied from the clock supply section 210, as shown in FIG. 3, respectively repeat a low level and a high level at a predetermined interval, and when one clock is at the high level, the other is at the low level so that the high levels of the two clocks do not overlap.

Switches SV1 to SV15 and switches SX1 to SX15 enter a closed state when φ1 is at the high level, and otherwise enter an open state as indicated by reference label φ1.

Switches SVG1 to SVG15 are connected to either the reference voltage source Vr+ or Vr− depending on a polarity (+1 or −1) of digital data Si (i=1 to 15). When φ1 is at the high level and the polarity of digital data is "+1", the switches SVG1 to SVG15 are connected to the reference voltage source Vr+ (labeled Si·φ1). On the, other hand, when φ1 is at the high level and the polarity of digital data Si "−1", the switches SVG1 to SVG15 are connected to the reference voltage source Vr− (labeled Sib·φ1).

Likewise, the switches SXG1 to, SXG15 are connected to either the reference voltage source, Vr+ or Vr− depending on a polarity (+1 or −1) of digital data Si (i=1 to 15). When φ1 is at the high level and the polarity of digital data Si is "+1" the switches SXG1 to SXG15 are connected to the reference voltage source Vr+ (labeled Si·φ1). On the other hand, when φ1 is at the high level at the polarity of digital data Si is "−1", the switches SVG1 to SVG15 are connected to the reference voltage source Vr− (labeled Sib·φ1).

The switches SCI, SC2 and the switches SZ1 to SZ15, SD1 to SD15 enter a closed state when φ2 is at the high level, and otherwise enter an open state (this situation is indicated by labeling φ2).

The operation of the circuit in FIG. 6 depends on the state of clocks φ1 and φ1. First, when φ1 is at the high level, the switches SV1 to SVI15 and SX1 to SX15 enter the closed state, and the right-hand terminals of the capacitors C1 at the non-inverting output side, and left-hand terminals of the capacitors C1 at the inverting output side, are connected to ground. Furthermore, due to the operation of the switches SVG1 to SVG15 and the switches SXGI to SXGI5, depending op the polarity (+1 or −1) of the digital data S1 to S15, the left-hand terminals of the capacitors C1 at the non-inverting output side, and the right-hand terminals of the capacitors C2 at the inverting output side, are connected to the reference voltage source Vr+ or Vr−, and each of the capacitors C1 stores an electric charge corresponding to the reference voltage.

Next, when φ2 is at the high level, the switches SVG1 to SVG15, SXG1 to SXG15, SV1 to SV15, SX1 to SX15 enter the open state, and at the same time, the switches SC1, SC2, SZ1 to SZ15 and SD1 to SD15 enter the closed state, and each of the capacitor C1 at the non-inverting output side is connected in parallel to one another between the non-inverting output terminal and the inverting input terminal of the operational amplifier 110. At the same time, each of the capacitors C1 at the inverting output side is connected in parallel to one another between the inverting output terminal and the non-inverting input terminal of the operational amplifier 110.

Distribution of the electric charges occurs among parallel-coupled capacitors C1, and in accordance with the law of electric charge conservation and from equation (7), the following equation (10) is derived. Using equation (7), supposing that the 15 capacitors C1 to C15 have the same capacitance. When neglecting the capacitor Cfb in the switched-capacitor circuit at the non-inverting output side, the following equation (10) is produced:

$$Vr·(S15·C1+S14·C1+ \ldots +S1·C1)=OUT+·C1·15 \qquad (10)$$

From equation (10), the output voltage OUT+ delivered from the non-inverting output terminal is given by the following equation (11):

$$OUT+=Vr·(S15+S14+ \ldots +S1)/15 \qquad (11)$$

This means that the 15 level, linear level type, D/A conversion operation is realized. Furthermore, as shown in FIG. 6, since the digital data which controls the switching of the capacitors at the inverting output side has the opposite polarity to that of the non-inverting output side, similar to equation (11), the output voltage OUT− delivered from the inverting output terminal is obtained from the following equation (12):

$$OUT-=-Vr·(S15+S14+ \ldots +S1)/15 \qquad (12)$$

In a fully differential circuit, a difference (differential output) between the voltage delivered from the non-inverting output terminal and the voltage delivered from the inverting output terminal is the output signal of interest. The differential output by OUT is expressed as follows:

$$OUT=(OUT+)-(OUT-)=2Vr·(S15+S14+ \ldots +S1)/15 \qquad (13)$$

When comparing the outputs of the single ended (one side) circuits of equation (11) and equation (12), it will be seen that in the fully differential circuit, a signal amplitude is increased by 6 db. Owing to this, the influence of the thermal noise generated by the operation amplifier on the S/N ratio is improved 6 dB. In other words, the current consumption can be reduced to half while maintaining the S/N ratio.

It is also possible to realize a binary type D/A converter by setting the capacitance values of the capacitors at the non-inverting output side and at the inverting output side in a binary ratio. In this case, the output Is expressed by $OUT=2·Vr·(Si·2^{i-1}+Si-1·2^{i-2}+ \ldots +S1)/(2^i-1)$.

Furthermore, as described above, the switched-capacitor D/A converter according to the present invention has a low-pass characteristic. The feedback capacitor Cfb in the circuit of FIG. 5 is assumed to have a capacitance value of 30·C1 in FIG. 6. When rewriting equation (10) in the fully differential type as in equation (13) to include the influence of the feedback capacitor, the following equation (14) is obtained:

$$OUT[n-1]·30C1+2Vr·(S15+S14+ \ldots +S1)·C1=OUT[n]·(30C1+15C1) \qquad (14)$$

Here, OUT [n−1] indicates the conversion result of the last period of the D/A conversion which is performed periodically. In equation (14), when expressing in Z− transform notation as OUT [n−1]=OUT·$Z^{-1}$, and solving a Z function, the following equation (15) is obtained:

$$OUT=2Vr·((S15+S14+ \ldots +S1)/15)·(1/(3-2·Z^{-1})) \qquad (15)$$

It will be seen that the result of D/A conversion of equation (13) is multiplied by the term $1/(3-2·Z^{-1})$, which has the low-pass characteristic. By providing the feedback capacitor Cfb to hold the D/A conversion result of the last period, it is possible to obtain the low-pass characteristic. For example, supposing that the sampling frequency of the switched-capacitor D/A converter is 44.1 kHz·64=2.8224 MHz, equation (15) represents a first-order low-pass filter characteristic having a cut-off frequency of 150 kHz.

The cut-off frequency is determined in the following manner. Specifically, the cut-off frequency Fc of the low pass characteristic of the term $1/(3-2·Z^{-1})$ in equation (15) is given by obtaining a solution to equation (16) as follows:

$$3-2-Z^{-1} \qquad (16)$$

Furthermore, Fs is determined by approximating equation (16) to formulate equation (17) as follows:

$$Z=1+s/Fos \qquad (17)$$

, where Fos is an oversampling frequency. Since, according to equation (18), as follows:

$$s=Fos/3 \qquad (18)$$

equations (16) and (17) can be reduced to Fc=s/(2·π)=Fos/(2·π·3), where π is used in the conventional sense to represent "pi", which is approximately 3.14159265. When substituting, Fos=2.8244 MHz, then Fc=149.7 kHz is obtained.

Furthermore, since the delta-sigma D/A converter performs oversampling, this low-pass characteristic does not affect the frequency band in which the signal processing is carried out. In further accordance with the present embodiment, in order to eliminate quantization noise, it is possible to utilize this low-pass characteristic by increasing the capacitance value of the feedback capacitor Cfb. In so doing, current consumption is not increased.

Figure 7:
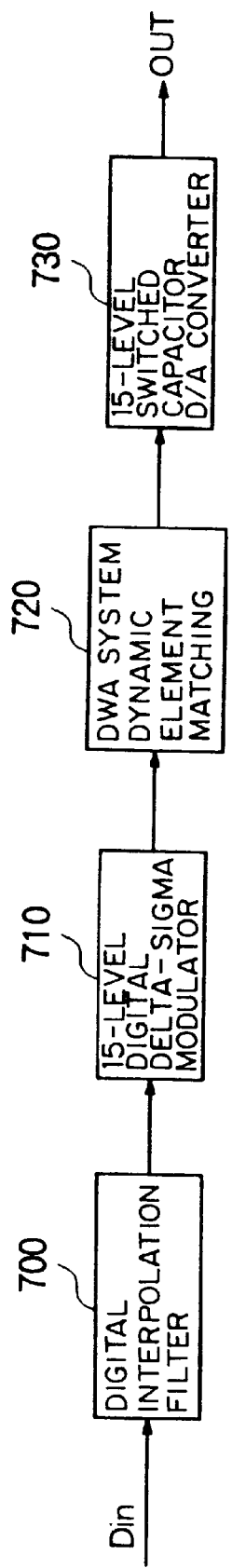
FIG. 7 is a block diagram of a delta-sigma D/A converter, including a digital interpolation filter, a delta-sigma modulator, a DEM and a D/A converter, according to one embodiment of the present invention.

Next, with reference to FIGS. 7 and 8, a delta-sigma type D/A converter in another embodiment will be explained. FIG. 7 shows a block diagram of the delta-sigma D/A converter according to one embodiment. The delta-sigma D/A converter comprises a digital interpolation filter 700 for converting a digital signal sampled at a predetermined sampling frequency into a digital signal at a frequency higher than the sampling frequency. A 15-level digital delta sigma modulator 710 converts the interpolated digital signal to a noise shaped lower bit number (15 level) digital signal. A DEM 720 employing the DWA algorithm is shown coupled to the output of modulator 710, and a 15-level switched-capacitor D/A converter 730 is coupled to the output of DEM 720.

The 15-level switched capacitor D/A converter 730 may be implemented as shown in FIG. 6 or as shown in FIG. 5 (with capacitors C1 to Ci are made equal to C1). In the present delta-sigma D/A converter, the digital interpolation filter 700 interpolates the digital signal, and converts that signal into a second digital signal at a frequency higher than the sampling frequency. The 15-level digital delta-sigma modulator 710 performs noise shaping of the second digital signal to convert the second digital signal into a third digital signal of a lower bit number. The digital signal which is processed by the DWA algorithm dynamic element matching 720 is D/A converted by the 15-level switched-capacitor D/A converter 730.

In the case where the D/A converter shown in FIG. 5 is a 15-level switched-capacitor D/A converter 730 (however, the capacitance values of all the capacitors C1 to Ci (i=15) are made the same value), a plurality of capacitor's C1 to Ci (when φ1 is at a high level and depending on a digital signal) store an electric charge corresponding to a predetermined reference voltage, Vr+ or Vr−. When 42 is at a high level, the switches SY1 to SYi and the switch SB are closed, and each of the capacitors C1 to Ci is connected in parallel to one another between the input terminal and the output terminal of the operational amplifier 100. At this time, since the charge supply operation by the operational amplifier 100 is not performed, it is possible to realize a delta-sigma D/A converter constituted by including the D/A converter which has small power consumption and, high accuracy.

In the case where the D/A converter shown in FIG. 6 is a 15-level switched-capacitor D/A converter 730, the capacitors C1 at the non-inverting output side and at the inverting output side (when φ1 is at a high level and depending on a digital signal) store an electric charge corresponding to a predetermined reference voltage Vr+ or Vr−. When φ2 is at a high level, the switches SC1, SC2, and SZ1 to SZ15 and SD1 to SD15 are closed, and each of the capacitors C1 at the non-inverting output side is connected in parallel to one another between the inverting input terminal and the non-inverting output terminal of the operational amplifier 110. At the same time, each of the capacitors C1 at the inverting output side is connected in parallel to one another between the non-inverting input terminal and the inverting output terminal of the operational amplifier 110. During this time, the electric charge supply operation by the operational amplifier 110 is not performed and the current consumption is small. Additionally, the S/N ratio is improved due to the fully differential operation. Thus, it is possible to realize a delta-sigma D/A converter which includes a D/A converter which has small current consumption, improved S/N ratio and high accuracy.

Figure 8:
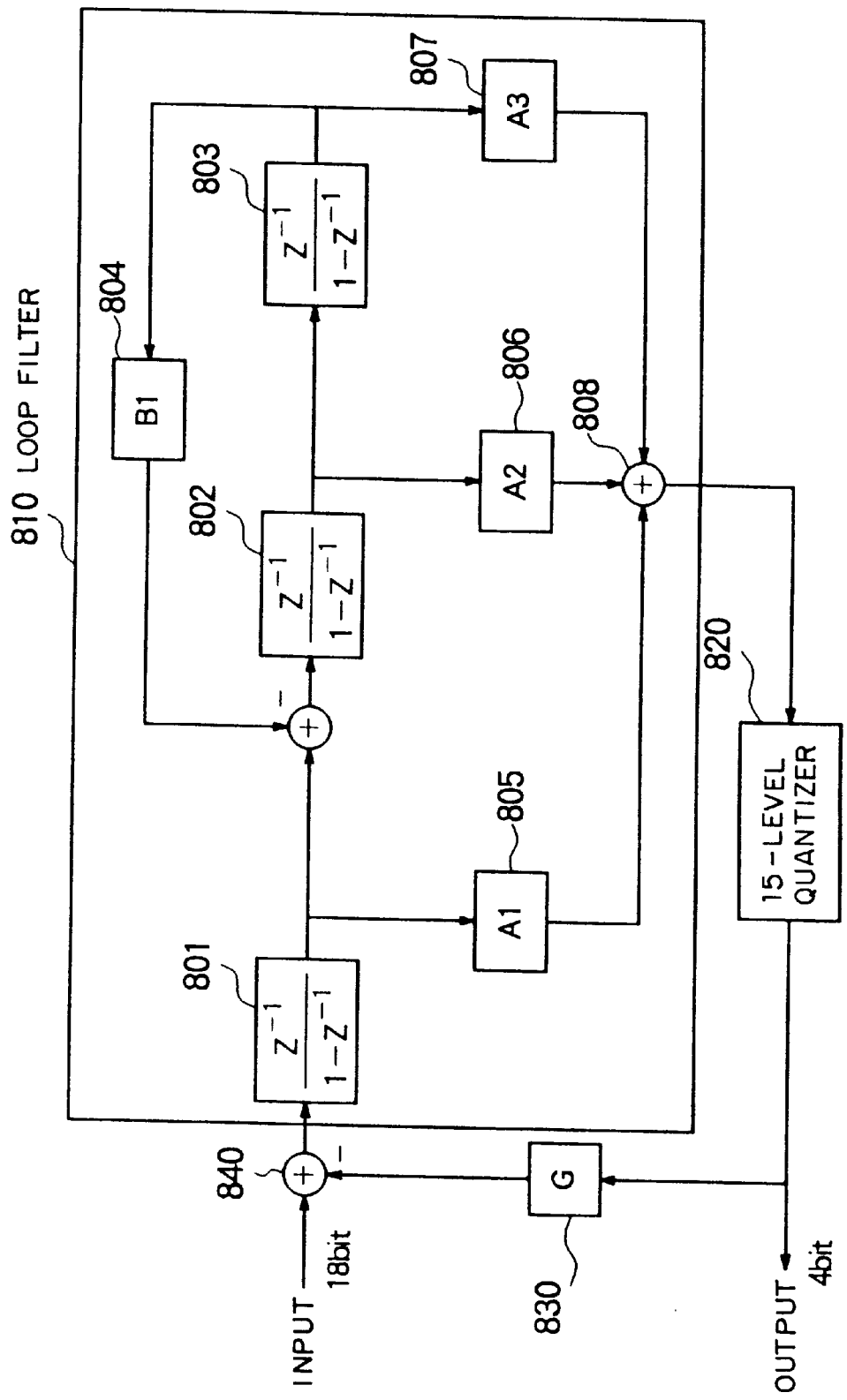
FIG. 8 is a block diagram of a delta-sigma modulator according to one embodiment at the present invention.

FIG. 8 shows an example of an arrangement of the 15-level digital delta-sigma modulator 710. This 15-level digital delta-sigma modulator 710 is deemed a third-order Sodini Loop, and comprises a third-order loop filter 810, a 15-level quanitizer 820 for quantizing at 15 levels, and an adder 840 for adding a feedback value by a feedback loop including a gain 830 (i.e., amplification factor) and an input. In the loop filter 810, the numerals 801, 802 and 803, respectively, designate integrators, the numerals 804, 805, 806, 807 designate multipliers of coefficients B1, A1, A2, A3, and the numeral 808 designates an adder.

Gain 830 is indispensable in the delta-sigma modulator having a third order negative feedback loop, and is used to prevent oscillation at the time of inputting large amplitudes. Insertion of feedback gain "G" will provide input scaling of equivalently "1/G". Accordingly, if the value of "1/G" is adjusted so that, for example, the gain of the feedback loop is larger than 1.0, the output amplitude of the 15-level switched-capacitor D/A converter 730 at the last stage can be attenuated, and the oscillation at the time of inputting a large amplitude can also be prevented.

The switched-capacitor D/A converter, in the embodiment shown in FIGS. 5 and 6, is arranged so that the capacitors which sample the reference voltage from the reference voltage source are also used as capacitors which constitute the feedback loop. For this reason, the gain of the switched-capacitor D/A converter itself is fixed to one. When adjusting the output level of the D/A converter, it is necessary to adjust a signal amplitude at any stages preceding the switched capacitor D/A converter 730. By adjusting the value of gain 830 in FIG. 8 to become, for example, equal to or larger than one, and by taking into consideration the oscillation prevention of the 15-level digital delta-sigma modulator 710 and the signal gain of the entire DIA converter, it is possible to adjust the signal amplitude without adding a new circuit.

In this respect, such a digital delta-sigma modulator 710 itself is described in, for example, Welland et. al. "Stereo 16 bit Delta-Sigma A/D Converter for Digital Audio", Vol., 37, pp. 476–486, June 1989, etc. Thus, it is believed a detailed description of its modulator 710 operation and the like are not necessary.

The data weighted averaging ("DWA") algorithm employed in DEM 720 is described in Baird et. al., "Linearity Enhancement of the Multi-Bit Delta-Sigma A/D and D/A Converter Using Data Weighted Averaging", IEEE Tran. on Cir. and Sys. −11 Vol. 42, No. 12, pp. 753–762, December. 1995, etc.

The DWA algorithm is a system for linear noise shaping the noise components generated due to mismatching of analog elements. DWA algorithm uses equally weighted analog elements (specifically, capacitors C1 to Ci) cyclically in sequence. DWA is generally well know as is omitted for sake of brevity.

Even when the DWA algorithm is employed, if there are elements mismatching of 1% or more, tones will be generated as a result of the D/A conversion and the SN ratio will be deteriorated. In the present invention, since it is possible to use the D/A converter having small current consumption and small element mismatching by utilizing increased capacitance values, the deterioration of the S/N ratio due to the tones does not occur. Moreover, since the tones are not generated, there is no need to add a dither.

Generally, the switched-capacitor circuit operates with satisfactory accuracy if its signal settles within an acceptable range before the sampling edge of a control clock which controls the switched-capacitor circuit. For this reason, even when the control clock involves jitters, there is no influence. As a result, the delta-sigma D/A converter constituted by including the switched capacitor D/A converter arranged according to the embodiment of the present invention exhibits the characteristics of low power consumption, high S/N ratio, and non-susceptibility to clock jitter.

In the first aspect of the invention, since the plurality of capacitors store an electric charge corresponding to a predetermined reference voltage during a first period depending on a digital signal, and the switch section connects each of the plurality of capacitors between the input terminal and the output terminal of the operational amplifier during a second period, the electric charge supply operation by the operational amplifier is not performed. This makes it possible to realize a D/A converter with small power consumption and high accuracy.

In the second aspect of the invention, since the first and second plurality of capacitors store an electric charge corresponding to a predetermined reference voltage during a first period depending on a digital signal, the first switch section connects each of the first plurality of capacitors between the inverting input terminal and the non-inverting output terminal of the operational amplifier during a second period. At the same time, the second switched section connects each of the second plurality of capacitors between the non-inverting output terminal and the inverting output terminal of the operational amplifier during the second period. The electric charge supply operation by the operational amplifier is not performed, and it becomes possible to realize a D/A converter with small power consumption and with high accuracy, and at the same time, it is possible to improve the S/N ratio owing to the fully differential operation of the operational amplifier.

In the third aspect of the invention (in addition to the advantage in any of the first and second aspects), since the capacitance values of the plurality of capacitors are set from the small value to the large value sequentially with a binary ratio, it is possible to realize a binary type D/A converter.

In the fourth aspect of the invention (in addition to the advantage in any of the first and second aspects), since the capacitance values of the plurality of capacitors are set to be the same value, it is possible to realize a linear-level type D/A converter.

In the fifth aspect of the invention (in addition to the advantage in any of the first, second, third, and fourth aspects), since a capacitor is provided between the output terminal and the input terminal of the operational, it is possible to realize a D/A converter having a low-pass characteristic.

In the sixth aspect of the invention, since the digital interpolation converts a digital signal into a second digital signal at a frequency higher than the sampling frequency, and the digital delta-sigma modulator performs noise shaping of the second digital signal to convert into a third digital signal having a lower bit number and further, at D/A conversion by the D/A converter, the plurality of capacitors store an electric charge corresponding to a predetermined reference voltage depending on the third digital signal during the first period. The switch section connects each of the plurality of capacitors between the input terminal and the output terminal of the operational amplifier during the second period. The electric charge supply operation by the operational amplifier is not performed, and it becomes possible to realize a delta-sigma D/A converter constituted by including the D/A converter which has low power consumption and high accuracy.

In the seventh aspect of the invention, since the digital interpolation filter converts a digital signal into a second digital signal at a frequency higher than the sampling frequency, and the digital delta-sigma modulator performs noise shaping of the second digital signal to convert into a third digital signal having a lower bit number and further, at D/A conversion by the D/A converter, the first and second plurality of capacitors store an electric charge corresponding to a predetermined reference voltage depending on the digital signal during the first period, and the first switch section connects each of the first plurality of capacitors between the inverting input terminal and the non-inverting output terminal of the operational amplifier during the second period. The second switch section connects each of the second plurality of capacitors between the non-inverting input terminal and the inverting output of the operational amplifier during the second period. The electric charge supply operation by the operational amplifier is not performed, and it becomes possible to realize the D/A converter with low power consumption and high accuracy. At the same time, it is possible to realize a digital delta-sigma D/A converter constituted by including the D/A converter which has improved S/N ratio by the fully differential operation of the operational amplifier.

In the eighth aspect of the invention (in addition to the advantage of any of the sixth and seventh aspects), since the dynamic element matching is provided between the delta-sigma modulator and the D/A converter, the S/N ratio can be improved.

In the ninth aspect of the invention (in the addition to the advantage of any of the sixth, seventh, and eighth aspects), since the capacitance value of the plurality of capacitors is set to be the same value, it is possible to realize a linear level type D/A converter function.

In the tenth aspect of the invention (in addition to the advantage of any of the sixth, seventh, eighth, and ninth aspects), since the feedback loop of the delta-sigma modulator has a gain larger than one, it is possible to prevent the oscillation in the delta-sigma modulator and at the same time adjust the gain of the D/A conversion.

What is claimed is:

1. A D/A converter for converting a multi-bit digital signal into an analog signal, the D/A converter comprising:

a plurality of capacitors for storing, during a first time period, reference voltages corresponding with respective bits of the multi-bit digital signal, said reference voltages being delivered to respective ones of each of the plurality of capacitors; and a switch for connecting each of the plurality of capacitors in parallel to one another between an input terminal and an output terminal of an operational amplifier during a second period.

2. The D/A converter according to claim 1, wherein capacitance values of the plurality of capacitors are respectively set from a lesser to greater value sequentially in a binary multiple manner.

3. The D/A converter according to claim 1, wherein capacitance values of the plurality of capacitors are substantially equal.

4. The D/A converter according to claim 1, further comprising a feedback capacitor coupled between the output terminal and the input terminal of the operational amplifier to implement a low-pass function.

5. A D/A converter for converting a multi-bit digital signal into an analog signal, the D/A converter comprising:

a first plurality of capacitors for storing, during a first time period, reference voltages corresponding with respective bits of the multi-bit digital signal, said reference voltages being delivered to respective ones of the plurality of capacitors;

a first switch section for connecting each of the first plurality of capacitors in parallel to one another between an inverting input terminal and a non-inverting output terminal of an operational amplifier during a second period;

a second plurality of capacitors for storing, during the first time period, reference voltages corresponding with respective bits of the multi-bit digital signal, said reference voltages being delivered to respective ones of the plurality of capacitors; and a second switch section for connecting each of the second plurality of capacitors in parallel to one another between a non-inverting input terminal and an inverting output terminal of the operational amplifier during the second period.

6. The D/A converter according to claim 5, wherein capacitance values for the first plurality of capacitors and the second plurality of capacitors are respectively set from a lesser to greater value sequentially in a binary multiple manner.

7. The D/A converter according to claim 5, wherein capacitance values of the first plurality of capacitors and the second plurality of capacitors are substantially equal.

8. The D/A converter according to claim 5, further comprising a capacitor provided between the inverting input terminal and the non-inverting output terminal of the operational amplifier as well as between the non-inverting input terminal and the inverting output terminal of the operational amplifier to implement a low-pass function.

9. A delta-sigma D/A converter for sampling a multi-bit digital signal at a predetermined sampling frequency and converting the multi-bit digital signal into an analog signal, comprising:

a digital interpolation filter coupled to convert the digital signal into a second digital signal at a frequency greater than the sampling frequency by interpolating the digital signal;

a delta-sigma modulator coupled to convert the second digital signal into a third digital signal of a lower bit number by noise shaping the second digital signal; and a D/A converter coupled to perform a digital-to-analog conversion upon the third digital signal, wherein the D/A converter includes a plurality of capacitors for selectively storing, during a first time period, an electric charge corresponding to a word grouping of bits within the multi-bit digital signal delivered across a bus to respective ones of the plurality of capacitors, and a switch section for connecting each of the plurality of capacitors in parallel to one another between an input terminal and an output terminal of an operational amplifier during a second period; and dynamic element matching coupled between the delta-sigma modulator and the D/A converter.

10. The delta-sigma D/A converter according to claim 9, wherein the capacitance values of the plurality of capacitors are substantially equal.

11. The delta-sigma D/A converter according to claim 9, wherein a feedback loop of the delta-sigma modulator has a gain greater than 1.

12. A delta-sigma D/A converter for sampling a multi-bit digital signal at a predetermined sampling frequency and converting the multi-bit digital signal into an analog signal, comprising:

a digital interpolation filter coupled to convert the digital signal into a second digital signal at a frequency greater than the sampling frequency by interpolating the digital signal;

a delta-sigma modulator coupled to convert the second digital signal into a third digital signal of a lower bit number by noise shaping the second digital signal; and a D/A converter for performing a digital-to-analog conversion upon the third digital signal, wherein the D/A converter includes a first plurality of capacitors for selectively storing, during a first time period, an electric charge corresponding to a word grouping of bits within the multi-bit digital signal delivered across a bus to respective ones of the first plurality of capacitors, a first switch section for connecting each of the first plurality of capacitors in parallel to one another between an inverting input terminal and a non-inverting output terminal of an operational amplifier during a second period, a second plurality of capacitors for selectively storing, during the first time period, an electric charge corresponding to a word grouping of within the multi-bit digital signal delivered across a bus to respective ones of the second plurality of capacitors, and a second switch section for connecting each of the second plurality of capacitors in parallel to one another between a non-inverting input terminal and an inverting output terminal of the operational amplifier during the second period; and dynamic element matching coupled between the delta-sigma modulator and the D/A converter.

13. The delta-sigma D/A converter according to claim 12, wherein the capacitance values of the first plurality of capacitors are set to have the same value.

14. The delta-sigma D/A converter according to claim 12, wherein a feedback loop of the delta-sigma modulator has a gain greater than 1.

15. A method for converting a multi-bit digital signal into an analog signal, comprising:

supplying reference voltages corresponding to respective bits of the multi-bit digital signal across separate conductors to respective ones of a plurality of capacitors during a first time period; and connecting each of the plurality of capacitors in parallel between an input terminal and an output terminal of an operational amplifier during a second time period.

16. The method as recited in claim 15, wherein said supplying comprises charging the plurality of capacitors, and wherein said connecting comprises distributing charge among the plurality of capacitors and a feedback capacitor also connected between the input terminal and the output terminal.

17. The method as recited in claim 15, wherein said supplying comprises providing at least two dissimilar reference voltages at dissimilar times to the plurality of capacitors.

18. The method as recited in claim 15, wherein said second time period is subsequent to said first time period.

19. A method for converting a multi-bit digital signal into an analog signal, comprising:

supplying reference voltages corresponding to respective bits of the multi-bit digital signal across separate conductors to respective ones of a first plurality of capacitors during a first time period; and connecting each of the first plurality of capacitors in parallel between an inverting input terminal and a non-inverting output terminal of an operational amplifier during a second time period.

20. The method as recited in claim 19, wherein said supplying comprises charging the first plurality of capacitors, and wherein said connecting comprises distributing charge among the plurality of capacitors and a feedback capacitor also connected between the inverting input terminal and the non-inverting output terminal.

21. The method as recited in claim 19, wherein said supplying comprises providing at least two dissimilar reference voltages at dissimilar times to the first plurality of capacitors.

22. The method as recited in claim 19, wherein said second time period is subsequent to said first time period.

23. The method as recited in claim 21, further comprising:
supplying reference voltages corresponding to respective bits of the multi-bit digital signal across separate conductors to respective ones of a second plurality of capacitors during the first time period; and connecting each of the second plurality of capacitors in parallel between a non-inverting input terminal and an inverting output terminal of an operational amplifier during the second time period.

24. The method as recited in claim 23, wherein said supplying comprises charging the second plurality of capacitors, and wherein said connecting comprises distributing charge among the plurality of capacitors and a feedback capacitor also connected between the non-inverting input terminal and the inverting output terminal.

25. The method as recited in claim 23, wherein said supplying comprises providing at least two dissimilar reference voltages at dissimilar times to the second plurality of capacitors.

26. The method as recited in claim 23, wherein said second time period is subsequent to said first time period.

* * * * *

UNITED STATES PATENT AND TRADEMARK OFFICE
CERTIFICATE OF CORRECTION

PATENT NO. : 5,990,819
DATED : November 23, 1999
INVENTOR(S) : Ichiro Fujimori

It is certified that error appears in the above-identified patent and that said Letters Patent is hereby corrected as shown below:

Claim 23, col. 19, line 15, after the phrase "as recited in claim" please delete "21" and substitute therefor --19--.

Signed and Sealed this

Twentieth Day of June, 2000

Attest:

Q. TODD DICKINSON

Attesting Officer

Director of Patents and Trademarks